United States Patent
Borland et al.

(10) Patent No.: US 7,259,036 B2
(45) Date of Patent: Aug. 21, 2007

(54) METHODS OF FORMING DOPED AND UN-DOPED STRAINED SEMICONDUCTOR MATERIALS AND SEMICONDUCTOR FILMS BY GAS-CLUSTER-ION-BEAM IRRADIATION AND MATERIALS AND FILM PRODUCTS

(75) Inventors: John O. Borland, South Hamilton, MA (US); John J. Hautala, Beverly, MA (US); Wesley J. Skinner, Andover, MA (US); Martin D. Tabat, Nashua, NH (US)

(73) Assignee: TEL Epion Inc., Billerica, MA (US)

( * ) Notice: Subject to any disclaimer, the term of this patent is extended or adjusted under 35 U.S.C. 154(b) by 39 days.

(21) Appl. No.: 11/057,653

(22) Filed: Feb. 14, 2005

(65) Prior Publication Data
US 2005/0181621 A1     Aug. 18, 2005

Related U.S. Application Data

(60) Provisional application No. 60/544,516, filed on Feb. 14, 2004, provisional application No. 60/621,911, filed on Oct. 25, 2004.

(51) Int. Cl.
*H01L 21/00*     (2006.01)
*H01L 21/322*    (2006.01)

(52) U.S. Cl. .................. 438/37; 438/45; 438/87; 438/473; 438/474

(58) Field of Classification Search .............. 438/36, 438/37, 45, 87, 473, 474, 795; 427/562, 427/585
See application file for complete search history.

(56) References Cited

U.S. PATENT DOCUMENTS

| 5,907,780 | A  | 5/1999  | Gilmer et al. |
| 6,251,835 | B1 | 6/2001  | Chu et al. .................. 505/411 |
| 6,963,078 | B2 | 11/2005 | Chu |
| 2002/0015808 | A1 | 2/2002 | Lindauer et al. |
| 2002/0036261 | A1 | 3/2002 | Dykstra ...................... 250/287 |
| 2002/0070361 | A1 | 6/2002 | Mack et al. ............ 250/505.1 |
| 2003/0109092 | A1 | 6/2003 | Choi et al. ................. 438/200 |
| 2004/0002202 | A1 | 1/2004 | Horsky et al. ............. 438/515 |

FOREIGN PATENT DOCUMENTS

WO    WO 2004/053945     6/2004

*Primary Examiner*—Hsien-Ming Lee
(74) *Attorney, Agent, or Firm*—Burns & Levinson LLP; Jerry Cohen; David W. Gomes

(57) ABSTRACT

Methods and apparatus are described for irradiating one or more substrate surfaces with accelerated gas clusters including strain-inducing atoms for blanket and/or localized introduction of such atoms into semiconductor substrates, with additional, optional introduction of dopant atoms and/or C. Processes for forming semiconductor films infused into and/or deposited onto the surfaces of semiconductor and/or dielectric substrates are also described. Such films may be doped and/or strained as well.

40 Claims, 12 Drawing Sheets

METHODS OF FORMING DOPED AND UN-DOPED STRAINED SEMICONDUCTOR MATERIALS AND SEMICONDUCTOR FILMS BY GAS-CLUSTER-ION-BEAM IRRADIATION AND MATERIALS AND FILM PRODUCTS

CROSS-REFERENCE TO RELATED APPLICATIONS

This application claims the benefit of priority to U.S. Provisional Application Ser. Nos. 60/544,516 filed 14 Feb. 2004, and 60/621,911 filed 25 Oct. 2004, each entitled "Formation of Doped and Un-Doped Strained Silicon and Semiconductor Films by Gas-Cluster Ion Irradiation", and both of which are hereby incorporated by reference in their entirety.

FIELD OF THE INVENTION

This invention relates generally to the formation of locally strained regions in semiconductor substrates and doped or un-doped thin films of semiconductor materials on semiconductor or other substrates, and more particularly, through energetic gas-cluster ion irradiation.

BACKGROUND OF THE INVENTION

The characteristics of semiconductor materials such as, for example, silicon, germanium and gallium arsenide and other semiconductors have been exploited to form a large variety of useful devices in the fields of electronics, communications, electro-optics, and nano-technology. In the field of semiconductor electronics, it is well established that formation of devices by utilizing strained-silicon can result higher carrier mobility and, thus, in superior device performance, including faster operation, higher current drive capability, and lower power dissipation.

Several approaches have been applied to produce suitably strained-silicon. These include formation of silicon films on mismatched crystalline lattice substrates, introducing larger or smaller atoms into the lattice, and mechanically applying tensile or compressive forces to silicon regions due to strains in adjacent regions. One particularly effective method has been the introduction of germanium atoms into a silicon lattice. Germanium atoms are larger than those of silicon and result in a strain of the predominately silicon lattice. Often germanium concentrations on the order of a few atomic percent to a few tens of atomic percent have been found useful in forming such silicon-germanium strained semiconductors.

Strained silicon materials for semiconductor device fabrication have been formed by blanket Si/SiGe epitaxy onto silicon substrates or by blanket transfer of strained-silicon layers onto insulator substrates for producing strained-silicon on insulator (sSOI) materials. Previous methods (such as epitaxy) for producing blanket strained-silicon on semiconductor or insulating (typically silicon oxide) substrates involve low throughput, high temperature, techniques that result in undesirably high costs per wafer.

In addition to the blanket techniques, there has been recent development of semiconductor devices enjoying the benefits of strained-silicon by using localized processing such as selective chemical vapor deposition to produce locally-strained semiconductor regions. Locally-strained techniques are useful, in part, because PMOS devices and NMOS devices benefit from having different strains in the strained-silicon channels of the devices, thus it is desirable to be able to control the amount and type (compressive or tensile) strain in local regions within a device or from device to device. Such local-strain techniques have also been expensive to implement and typically utilize high processing temperatures that can be a disadvantage in some applications.

Conventional ion implantation using atomic or molecular ions of materials containing germanium has not proven an efficient way of introducing germanium into silicon for creating strain. The required high concentrations of at least a few atomic percent of germanium in silicon for effective strain production require such high conventional ion implantation doses so as to be economically impractical with conventional ion implantation equipment.

For some semiconductor devices, it is desirable to dope the semiconductor material with, for example, boron at very high doping concentrations. In general, the solid solubility limit of the dopant in silicon has been an upper limit for effective doping. Past work indicates that the solid solubility limit of boron in silicon can be increased by introducing germanium atoms to the silicon.

The use of a gas-cluster ion beam (GCIB) for etching, cleaning, and smoothing surfaces is known (see for example, U.S. Pat. No. 5,814,194, Deguchi, et al.) in the art. GCIBs have also been employed for assisting the deposition of films from vaporized carbonaceous materials (see for example, U.S. Pat. No. 6,416,820, Yamada, et al.) As the term is used herein, gas-clusters are nano-sized aggregates of materials that are gaseous under conditions of standard temperature and pressure. Such clusters may comprise aggregates of from a few to several thousand molecules or more loosely bound to form the cluster. The clusters can be ionized by electron bombardment or other means, permitting them to be formed into directed beams of controllable energy. Such ions each typically carry positive charges of $q \cdot e$ (where e is the magnitude of the electronic charge and q is an integer of from one to several representing the charge state of the cluster ion). The larger sized clusters are often the most useful because of their ability to carry substantial energy per cluster ion, while yet having only modest energy per molecule. The clusters disintegrate on impact, with each individual molecule carrying only a small fraction of the total cluster energy. Consequently, the impact effects of large clusters are substantial, but are limited to a very shallow surface region.

Apparatus for creating and accelerating such GCIBs are described in the U.S. Pat. No. 5,814,194 patent previously cited. Presently available ion cluster sources produce clusters ions having a wide distribution of sizes, N, up to N of several thousand (where N=the number of molecules in each cluster—in the case of monatomic gases like argon, an atom of the monatomic gas will be referred to herein as either an atom or a molecule and an ionized atom of such a monatomic gas will be referred to as either an ionized atom, or a molecular ion, or simply a monomer ion.)

SUMMARY OF THE INVENTION

It is therefore an object of this invention to provide for blanket and/or localized introduction of germanium or other strain-inducing atoms into semiconductor substrates by energetic cluster ion irradiation.

It is another object of this invention to provide for the formation of semiconductor films or strained semiconductor films at (infused into and deposited onto) the surfaces of semiconductor or dielectric substrates by energetic cluster ion irradiation.

It is a further object of this invention to provide for blanket and/or localized introduction of germanium or other strain-inducing atoms and dopant atoms into semiconductor substrates by energetic cluster ion irradiation.

A still further object of this invention is to provide for the formation of doped semiconductor films or strained semiconductor films infused into or deposited onto semiconductor or dielectric substrates by energetic cluster ion irradiation.

The objects set forth above as well as further and other objects and advantages of the present invention are achieved by the embodiments of the invention described hereinbelow.

BRIEF DESCRIPTION OF THE FIGURES

For a better understanding of the present invention, together with other and further objects thereof, reference is made to the accompanying drawing and detailed description, wherein.

DETAILED DESCRIPTION OF THE INVENTION

Figure 1:
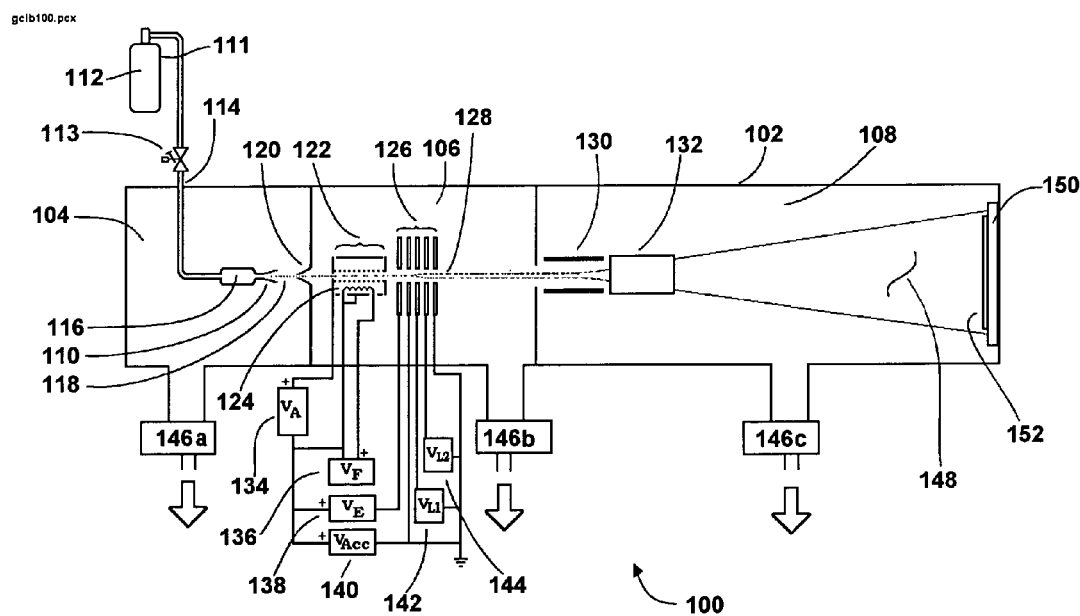
FIG. 1 is a schematic showing the basic elements of a prior art GCIB processing apparatus that uses an electrostatically scanned beam.

FIG. 1 shows a schematic of the basic elements of a typical configuration for a processing apparatus 100 for generating a GCIB in accordance with the present invention. Apparatus 100 may be described as follows: a vacuum vessel 102 is divided into three communicating chambers, a source chamber 104, an ionization/acceleration chamber 106, and a processing chamber 108. The three chambers are evacuated to suitable operating pressures by vacuum pumping systems 146a, 146b, and 146c, respectively. A condensable source gas 112 (for example argon or $N_2$) stored in a gas storage cylinder 111 is admitted under pressure through gas metering valve 113 and gas feed tube 114 into stagnation chamber 116 and is ejected into the substantially lower pressure vacuum through a properly shaped nozzle 110. A supersonic gas jet 118 results. Cooling, which results from the expansion in the jet, causes a portion of the gas jet 118 to condense into clusters, each consisting of from several to several thousand weakly bound atoms or molecules with an average size of between about 100 to about 30,000 molecules. A gas skimmer aperture 120 partially separates the gas molecules that have not condensed into a cluster jet from the cluster jet so as to minimize pressure in the downstream regions where such higher pressures would be detrimental (e.g., ionizer 122, high voltage electrodes 126, and processing chamber 108). Suitable condensable source gases 112 include, but are not necessarily limited to argon, nitrogen, carbon dioxide, oxygen, and other gases.

After the supersonic gas jet 118 containing gas-clusters has been formed, the clusters are ionized in an ionizer 122. The ionizer 122 is typically an electron impact ionizer that produces thermoelectrons from one or more incandescent filaments 124 and accelerates and directs the electrons causing them to collide with the gas-clusters in the gas jet 118, where the jet passes through the ionizer 122. The electron impact ejects electrons from the clusters, causing a portion the clusters to become positively ionized. A set of suitably biased high voltage electrodes 126 extracts the cluster ions from the ionizer, forming a beam, then accelerates them to a desired energy (typically from 1 keV to 70 keV) and focuses them to form a GCIB 128. Filament power supply 136 provides filament voltage $V_f$ to heat the ionizer filament 124. Anode power supply 134 provides anode voltage $V_A$ to accelerate thermoelectrons emitted from filament 124 to cause them to irradiate the cluster containing gas jet 118 to produce ions. Extraction power supply 138 provides extraction voltage $V_E$ to bias a high voltage electrode to extract ions from the ionizing region of ionizer 122 and to form a GCIB 128. Accelerator power supply 140 provides acceleration voltage $V_{Acc}$ to bias a high voltage electrode with respect to the ionizer 122 so as to result in a total GCIB acceleration equal to $V_{Acc}$. One or more lens power supplies (142 and 144 shown for example) may be provided to bias high voltage electrodes with focusing voltages ($V_{L1}$ and $V_{L2}$ for example) to focus the GCIB 128.

A workpiece 152, which may be a semiconductor wafer or other workpiece to be processed by GCIB processing, is held on a workpiece holder 150, disposed in the path of the GCIB 128. Since most applications contemplate the processing of large workpieces with spatially uniform results, a scanning system is desirable to uniformly scan the GCIB 128 across large areas to produce spatially homogeneous results. Two pairs of orthogonally oriented electrostatic scan plates 130 and 132 can be utilized to produce a raster or other scanning pattern across the desired processing area. When beam scanning is performed, the GCIB 128 is converted into a scanned GCIB 148, which scans the entire surface of workpiece 152.

Figure 2:
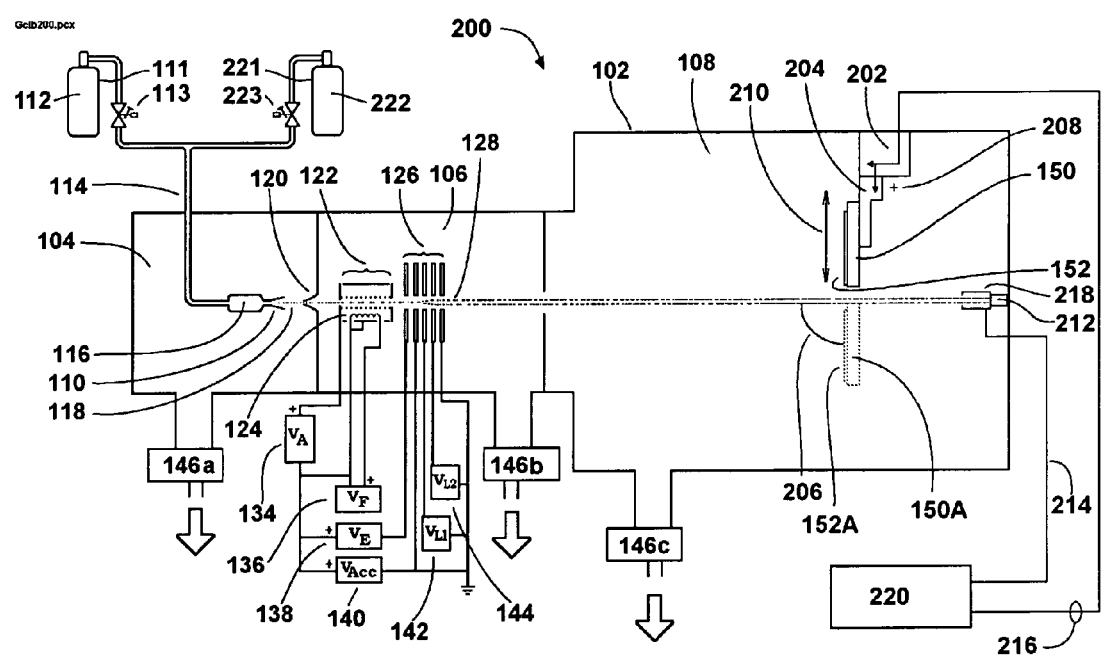
FIG. 2 is a schematic showing the basic elements of a prior art GCIB processing apparatus that uses a stationary beam with mechanical scanning of the workpiece and that includes provision for mixing source gases.

FIG. 2 shows a schematic of the basic elements of a prior art mechanically scanning GCIB processing apparatus 200 having a stationary beam with a mechanically scanned workpiece 152, and having a conventional faraday cup for beam measurement and a conventional thermionic neutralizer. GCIB formation is similar to as shown in FIG. 1, except there is additional provision for an optional second source gas 222 (typically different from the source gas 112) stored in a gas storage cylinder 221 with a gas metering valve 223 and connecting through gas feed tube 114 into stagnation chamber 116. Although not shown, it will be readily appreciated by those of skill in the art that three or more source gases can easily be arranged for by adding additional gas storage cylinders, plumbing, and valves. This multiple gas arrangement allows for controllably selecting between two differing source gasses 112 and 222 or for controllably forming a mixture of two (or more) source gasses for use in forming gas-clusters. It is further understood that the source gases, 112, and 222, may themselves be mixtures of gases, for examples argon plus 1% diborane, or argon plus 5% germane. In addition, in the mechanically scanning GCIB processing apparatus 200 of FIG. 2, the GCIB 128 is stationary (not electrostatically scanned as in the GCIB processing apparatus 100) and the workpiece 152 is mechanically scanned through the GCIB 128 to distribute the effects of the GCIB 128 over a surface of the workpiece 152.

An X-scan actuator 202 provides linear motion of the workpiece holder 150 in the direction of X-scan motion 208 (into and out of the plane of the paper). A Y-scan actuator 204 provides linear motion of the workpiece holder 150 in the direction of Y-scan motion 210, which is typically orthogonal to the X-scan motion 208. The combination of X-scanning and Y-scanning motions moves the workpiece 152, held by the workpiece holder 150 in a raster-like scanning motion through GCIB 128 to cause a uniform irradiation of a surface of the workpiece 152 by the GCIB 128 for uniform processing of the workpiece 152. The workpiece holder 150 disposes the workpiece 152 at an angle with respect to the axis of the GCIB 128 so that the GCIB 128 has an angle of beam incidence 206 with respect to the workpiece 152 surface. The angle of beam incidence 206 may be 90 degrees or some other angle, but is typically 90 degrees or very near 90 degrees. During Y-scanning, the workpiece 152 held by workpiece holder 150 moves from the position shown to the alternate position "A", indicated by the designators 152A and 150A respectively. Notice that in moving between the two positions, the workpiece 152 is scanned through the GCIB 128 and in both extreme positions, is moved completely out of the path of the GCIB 128 (over-scanned). Though not shown explicitly in FIG. 2, similar scanning and over-scan is performed in the (typically) orthogonal X-scan motion 208 direction (in and out of the plane of the paper).

A beam current sensor 218 is disposed beyond the workpiece holder 150 in the path of the GCIB 128 so as to intercept a sample of the GCIB 128 when the workpiece holder 150 is scanned out of the path of the GCIB 128. The beam current sensor 218 is typically a faraday cup or the like, closed except for a beam-entry opening, and is affixed to the wall of the vacuum vessel 102 with an electrically insulating mount 212.

A controller 220, which may be a microcomputer based controller connects to the X-scan actuator 202 and the Y-scan actuator 204 through electrical cable 216 and controls the X-scan actuator 202 and the Y-scan actuator 204 so as to place the workpiece 152 into or out of the GCIB 128 and to scan the workpiece 152 uniformly relative to the GCIB 128 to achieve uniform processing of the workpiece 152 by the GCIB 128. Controller 220 receives the sampled beam current collected by the beam current sensor 218 by way of lead 214 and thereby monitors the GCIB and controls the GCIB dose received by the workpiece 152 by removing the workpiece 152 from the GCIB 128 when a predetermined desired dose has been delivered.

Upon impact of an energetic gas-cluster on the surface of a solid target, penetration of the atoms of the cluster into the target surface is typically very shallow because the penetration depth is limited by the low energy of each individual constituent atom and depends principally on a transient thermal effect that occurs during the gas-cluster ion impact. Gas-clusters dissociate upon impact and the individual gas atoms then become free to recoil and possibly escape from the surface of the target. Other than energy carried away by the escaping individual gas atoms, the total energy of the energetic cluster prior to impact becomes deposited into the impact zone on the target surface. This makes ion clusters effective for a variety of surface modification processes, without the tendency to produce deeper subsurface damage characteristic of conventional ion beam processing. The dimensions of a target impact zone are dependent on the energy of the cluster but are of the order of the cross-sectional dimensions of the impacting cluster and are small, for example, roughly 30 Angstroms in diameter for a cluster comprised of 1000 atoms. Because of the deposition of most of the total energy carried by the cluster into the small impact zone on the target, an intense thermal transient occurs within the target material at the impact site. The thermal transient dissipates quickly as energy is lost from the impact zone by conduction deeper into the target. Duration of the thermal transient is determined by the conductivity of the target material but will typically be less than $10^{-6}$ second.

Near a cluster impact site, a volume of the target surface can momentarily reach temperatures of many hundreds to several thousands of degrees Kelvin. As an example, impact of a cluster carrying 10 keV total energy is estimated to be capable of producing a momentary temperature increase of about 2000 degrees Kelvin throughout a highly agitated, approximately hemispherical zone extending to about 100 Angstroms below a silicon surface.

Following initiation of an elevated temperature transient within the target volume below an energetic cluster impact site, the affected zone cools rapidly. Some of the cluster constituents escape during this process, while others remain behind and become incorporated in the surface. A portion of the original surface material may also be removed by sputtering or like effects. In general, the more volatile and inert constituents of the cluster are more likely to escape, while the less volatile and more chemically reactive constituents are more likely to become incorporated into the surface. Although the actual process is likely much more complex, it is convenient to think of the cluster impact site and the surrounded affected zone as a "melt zone" wherein the cluster atoms may briefly interact and mix with the substrate surface and wherein the cluster materials either escape the surface or become infused into the surface to the depth of the affected zone. The terms "infusion" and "infusing" are used herein to refer to this process and to distinguish it from ion "implantation" or "implanting," a very different process that produces very different results. Unlike conventional ion implantation, GCIB infusion does not introduce significant amounts of power into the processed substrate and, thus, may be performed as a low (i.e., room) temperature process that does not result in any significant heating of the substrate. Noble gases in the energetic cluster ion, such as argon and xenon, for example, being volatile and non-reactive, have a high probability of escape from the affected zone, while materials such as boron, germanium, and silicon, for example, being less volatile and more likely to form chemical bonds, are more likely to remain in the affected zone and to become incorporated in the surface of the substrate.

Noble inert gases such as argon and xenon, for example, not for limitation, can be mixed with gases containing elements that form semiconductors, germanium or silicon, for example, and/or with gases that contain elements that act as dopants for semiconductor materials, boron, phosphorous and arsenic, for example, to form compound gas-clusters containing different selected elements. Such gas-clusters can be formed with GCIB processing equipment as will be described hereinafter, by using suitable source gas mixtures as the source gas for gas-cluster ion beam generation, or by feeding two or more gases (or gas mixtures) into the gas-cluster ion generating source and allowing them to mix in the source. Germanium-containing gases such as germane ($GeH_4$) or germanium tetrafluoride ($GeF_4$), for example, may be employed for incorporating germanium into gas-clusters. Silicon-containing gases such as silane ($SiH_4$) and silicon tetrafluoride ($SiF_4$), for example, may be employed for incorporating silicon into gas-clusters. Dopant-containing gases such as diborane ($B_2H_6$), boron trifluoride ($BF_3$), phosphine ($PH_3$), phosphorous pentafluoride ($PF_5$), arsine ($AsH_3$), arsenic pentafluoride ($AsF_5$), as examples, may be employed for incorporating dopant atoms into gas-clusters. In one embodiment of the present invention, argon and germane, for example, can be mixed to make a source gas for forming clusters for infusing germanium. As another example, argon, germane, and diborane can be mixed to form a source gas for forming clusters containing germanium and boron for infusing germanium and boron. As still another example, argon, silane, and germane can be mixed to form a source gas for forming clusters containing both boron and silicon for forming silicon-germanium films on a substrate.

For some semiconductor products, an important requirement for the introduction of dopants into the semiconductor surface or for the formations of films is that the maximum depth to which the dopant has been introduced, or that the maximum thickness of the formed film be rather shallow, on the order of a few hundred angstroms or less. GCIBs such as described herein are particularly suited for formation and processing of shallow films. While the gas-cluster ions may be accelerated to many tens of kilo-electron volts of energy, because the clusters typically consist of thousands of atoms, individual atoms have little energy and do not ballistically penetrate the irradiated surface to great depths as occurs in conventional ion implantation and other monomer ion processes. By controlling the energy of the gas-cluster, one can control the depth of energetic gas-cluster impact effects and, through such control, films of 100 angstroms or even less can be formed and/or processed. In addition, it is noted that the GCIBs are very efficient at infusing cluster constituents into the surfaces they irradiate. Conventional ion beams typically implant one or at most a few atoms per ion. The efficiency of the GCIBs described herein are much higher. As an example, a GCIB formed of clusters formed from a mixture of 5% germane in argon will typically incorporate from 100 to 2000 germanium atoms per gas-cluster ion into the irradiated surface, the exact number being controllably and repeatably dependent on beam parameters including nozzle flow. The infused films tend to be amorphous or polycrystalline, but they can be converted to crystalline films by applying a thermal annealing step, either a rapid anneal or a furnace anneal, preferably a non-diffusing or low-diffusing anneal.

Figure 3:
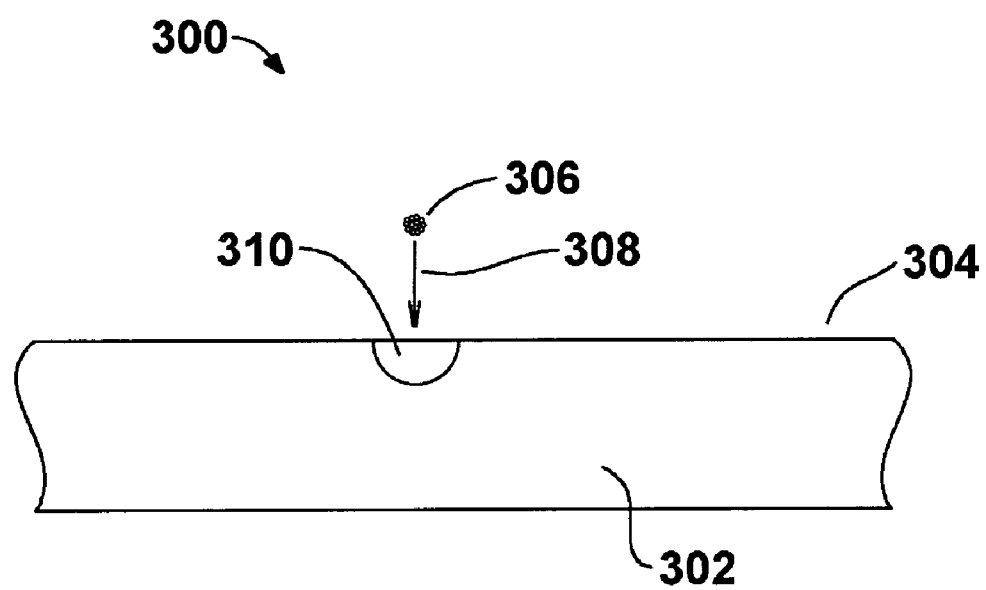
FIG. 3 is a schematic of a portion of a semiconductor wafer receiving gas-cluster ion irradiation.

FIG. 3 is an illustration of an interface region 300 of a semiconductor wafer 302 being impacted by a gas-cluster ion 306 comprising a mixture of noble gas and other gas molecules. The figure is not drawn to scale. The semiconductor wafer 302 has a surface 304 and is, for example, composed of a single crystal material and may be at any of several stages of processing for fabricating an integrated circuit or semiconductor device. The gas-cluster ion 306 having a trajectory 308 is shown impacting surface 304 of semiconductor wafer 302, where it forms a gas-cluster ion-impact region 310. According to the invention, gas-cluster ion 306 has been formed to be a cluster that includes semiconductor and/or dopant atom species. For example, the cluster might include diborane, germane, or other species in addition to a noble gas such as argon.

Figure 4:
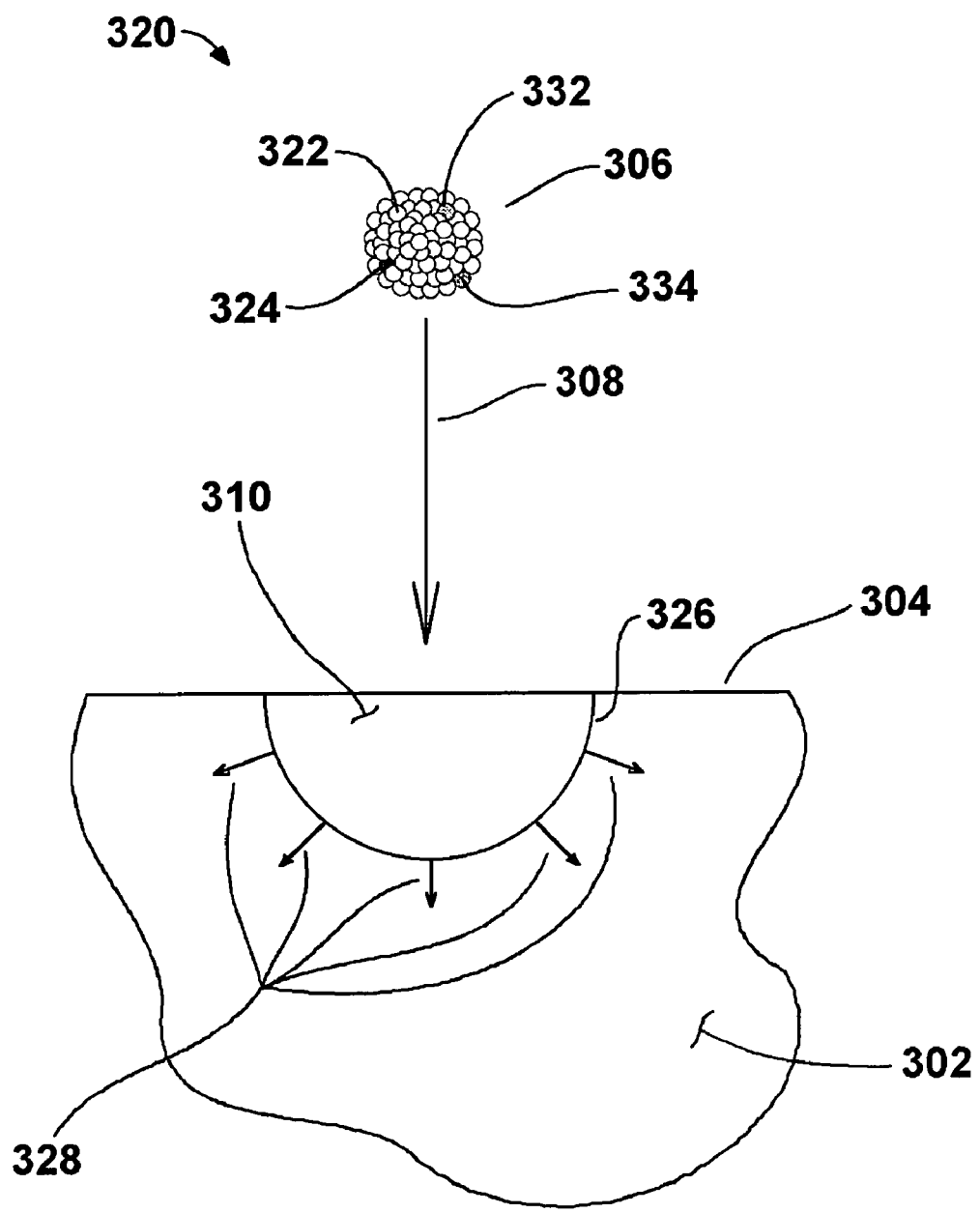
FIG. 4 is a schematic enlarging a portion of the semiconductor wafer from FIG. 3, showing additional detail including a mixed-gas-cluster ion.

FIG. 4 is an enlarged illustration of an interface region 320 of a portion of the semiconductor wafer 302 from FIG. 3, showing additional detail. Gas-cluster ion 306 comprises multiple molecules of at least two gases that include at least a noble gas and a gas with a semiconductor or dopant atom. The gas-cluster ion 306 contains noble gas atoms (represented by 322) and also contains at least a second species of gas molecules 324 that are semiconductor-material-containing gas molecules such as germane, for example. Optionally, the gas-cluster ion 306 may also contain one or more types (represented by items 332 and 334) of molecules of other species of gas which may be either semiconductor-material-containing gas molecules, (for example, silane), or dopant-containing gas molecules, (for example, diborane). Thus, the cluster 306 is comprised of at least a noble gas portion with fractional portions of at least one semiconductor-material-containing gas and optionally one or more additional semiconductor-material-containing gas or a dopant-containing gas. Such a gas-cluster ion 306 may be formed in a GCIB processing apparatus 200 as shown in or similar to that shown in FIG. 2, for example. When it is desired to have a mixture of gases in the gas-clusters, a premixed gas mixture with the desired mix can be provided in a single gas storage cylinder 111 (FIG. 2) or alternatively, separate, differing source gases or source gas mixtures 112 and 222 can be provided in gas storage cylinders 111 and 221 (FIG. 2) and then mixed in desired proportions as they flow to the stagnation chamber 116 (FIG. 2) by suitable adjustment of gas metering valves 113 and 223 (FIG. 2), which are preferably mass flow controller valves. Thus, it is possible to generate gas-cluster ion beams with a controllable mixture of two or more gasses.

Referring again to FIG. 4, the gas-cluster ion 306 is shown (for example and not for limitation) to comprise noble gas atoms 322, and semiconductor-material-containing gas molecules (represented by 324) along with (optional) other semiconductor-material-containing molecules or dopant-containing molecules (represented by 332 and 334). It is recognized that a wide range of mixtures of noble gas, dopant and semiconductor-material-containing gas molecules are useful in the present invention and that the clusters used for the process of the invention can be formed from noble gas mixed with very high concentrations of semiconductor-material-containing gas molecules and/or dopant gas molecules, or at the other extreme, the ratio of semiconductor-material-containing gas and/or dopant gas molecules to noble gas molecules may be so low that some or many gas-cluster ions do not contain even a single non-noble gas molecule, but wherein at least a portion of the gas-cluster ions in a gas-cluster ion beam comprise one or more molecules of semiconductor-material-containing and/or dopant gas. Typically, the concentration of semiconductor-material-containing gas or gases will range from a few to several molecular percent of the gas-cluster ions, but could comprise from 1 to 99 molecular percent, and optionally or alternatively comprise a carbon-material containing gas in similar percentages, while any dopant-containing gas molecules will be of lower molecular concentration in the gas-cluster ions such as, for example, between from about 0.01 to 10 molecular percent.

The gas-cluster ion-impact region 310 has a boundary 326. The volume of the gas-cluster ion-impact region 310 and hence it's depth of penetration of the surface of the semiconductor is dependent on the preselected and controlled energy of the gas-cluster ion 306. Upon impact of an energetic gas-cluster ion 306 on the surface 304, the gas-cluster ion 306 dissociates and the individual semiconductor and dopant molecules from the dissociated cluster become free. Inert gas molecules typically recoil and escape from the surface 304 of the semiconductor wafer 302. Some molecules including some of the semiconductor and/or dopant molecules become infused into the surface. Other than a small energy carried away by the escaping individual gas atoms, the total energy of the energetic gas-cluster ion 306 becomes deposited into the gas-cluster ion-impact region 310. The dimensions of the gas-cluster ion-impact region 310 are dependent on the energy of the cluster but are small—on the order of tens or hundreds of angstroms in diameter—depending on the preselected gas-cluster ion energy. Because of the deposition of most of the total energy carried by the gas-cluster ion 306 into the small gas-cluster ion-impact region 310, an intense thermal transient occurs within the material in the gas-cluster ion-impact region 310. The heat deposited in the gas-cluster ion-impact region 310 dissipates by conduction in the directions 328 deeper into the surrounding semiconductor material. Duration of the thermal transient is determined by the thermal conductivity of the surrounding material but will typically be less than $10^{-6}$ second.

In the gas-cluster ion-impact region 310, material can momentarily reach temperatures of many hundreds to several thousands of degrees Kelvin. Furthermore, it is recognized by the inventors that production of tensile or compressive strained semiconductor in a localized region can be productively used to produce an induced strain in a nearby or adjacent region or regions of a substrate. The induced strain can be either tensile or compressive depending on the relative geometries of the regions involved. As an example, impact of a gas-cluster ion 306 when carrying 10 keV total energy is estimated to be capable of producing a momentary temperature increase of about 2000 degrees Kelvin throughout an gas-cluster ion-impact region 310 extending to almost 100 Angstroms below the surface 304. Without being bound to a particular theory, it is believed that during the thermal transient, thermal agitation is high enough to possibly melt the material in the gas-cluster ion-impact region 310. As the gas-cluster ion-impact region 310 cools by thermal conduction in the directions 328, part of the semiconductor and/or dopant material in the impacted cluster becomes infused into the cluster ion impact region 310 and is incorporated into the cooled surface.

Figure 5:
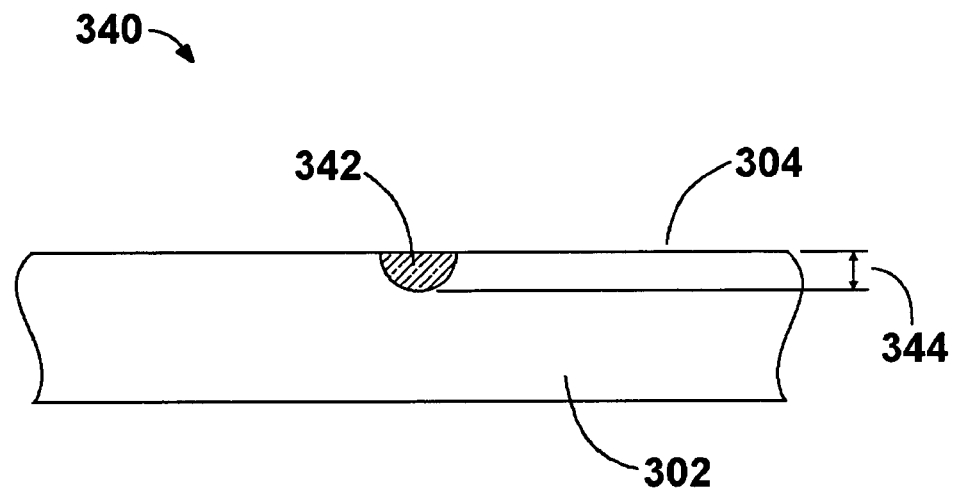
FIG. 5 is a schematic of a portion of a semiconductor wafer, showing modification of the surface in the affected zone of a cluster impact, according to the invention.

FIG. 5 is an illustration of an interface region 340 of a portion of a semiconductor wafer 302, showing infusion of semiconductor and/or dopant atoms into a region impacted by a gas-cluster ion, according to the present invention. After the gas-cluster ion-impact event described in FIG. 4, upon dissipation of the thermal transient, an infused region 342 replaces the gas-cluster ion-impact region 310 of FIG. 4. Infused region 342 extends to a depth 344 below the surface 304 of semiconductor wafer 302.

Figure 6:
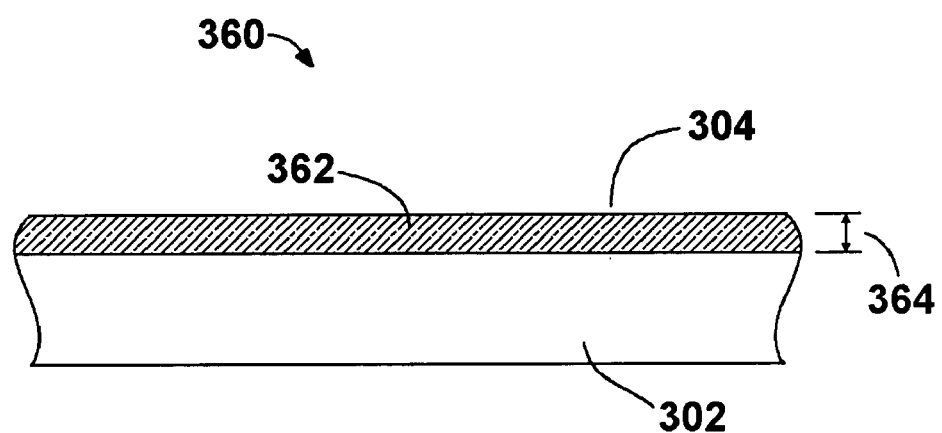
FIG. 6 is a schematic of a portion of a semiconductor wafer, showing modification of surface regions impacted by many gas-cluster ions forming a surface film according to the invention.

FIG. 6 is an illustration of an interface region 360 of a portion of a semiconductor wafer 302, showing an infused film 362 formed by completion of gas-cluster ion beam processing according to the present invention. With continued gas-cluster ion irradiation, infused regions similar to the infused region 342 (FIG. 5) form, overlap, and eventually develop the infused film 362, extending to a depth 364 below the surface 304 of the semiconductor wafer 302.

Figure 7:
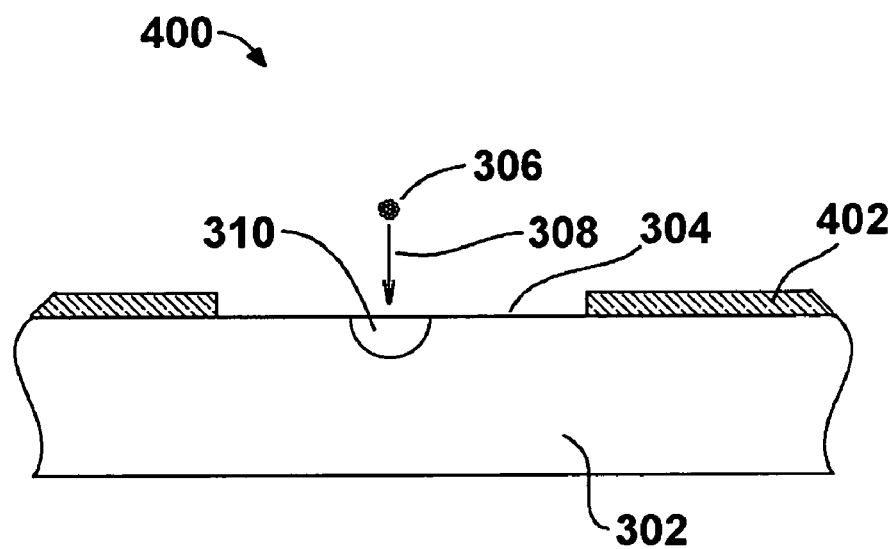
FIG. 7 is a schematic of a portion of a semiconductor wafer, showing mask controlled localization of processing during irradiation by gas-cluster ions.

FIG. 7 is an illustration of an interface region 400 of a portion of a semiconductor wafer 302 being impacted by a gas-cluster ion 306 comprising a mixture of noble gas and other gas molecules. The figure is not drawn to scale. The semiconductor wafer 302 has a surface 304 and is typically a single crystal material and may be at any of several stages of processing for fabricating an integrated circuit or semiconductor device. A portion of the surface 304 of the semiconductor wafer 302 is covered by a mask 402 that masks part of the surface 304 from irradiation by energetic clusters. A gas-cluster ion 306 having a trajectory 308 is shown impacting surface 304 of semiconductor wafer 302 in an unmasked region, where it forms a gas-cluster ion-impact region 310. Any clusters that strike the mask 402 are prevented by the mask from affecting the surface 304 of the semiconductor wafer 302. The mask 402 can be either a hard mask like silicon dioxide, or a soft mask such as photoresist material.

Figure 8:
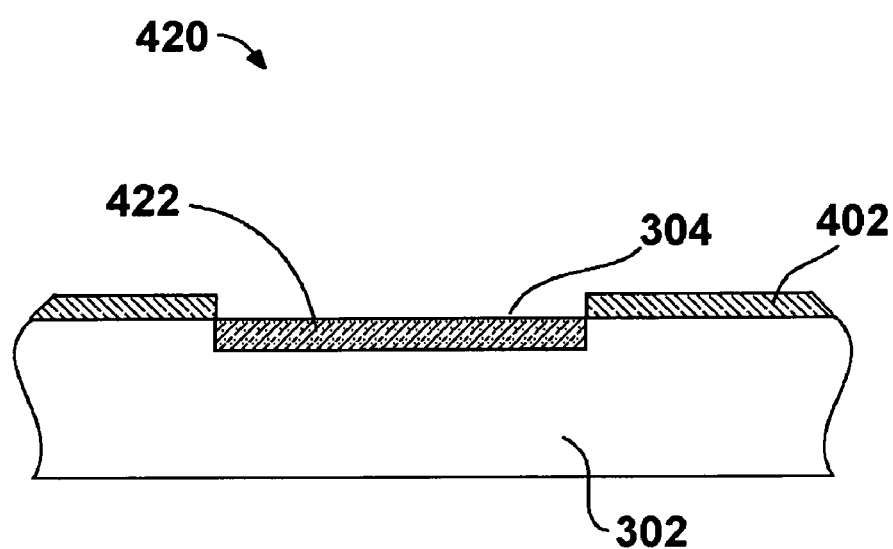
FIG. 8 is a schematic of a portion of a semiconductor wafer after mask controlled localization of processing during gas-cluster ion irradiation, with a localized surface film formed by the gas-cluster ion beam processing.

FIG. 8 is an illustration of an interface region 420 of a portion of a semiconductor wafer 302, showing an infused film 422 formed by completion of gas-cluster ion beam processing of the masked wafer shown in FIG. 7, according to the present invention. With continued gas-cluster ion irradiation, infused regions similar to the infused region (342 FIG. 5) form, overlap, and eventually develop the infused film 422 only at the exposed surface regions of the mask 402.

FIGS. 6 and 8 show the formation of processed films (362 and 422) on semiconductor substrates. Strained silicon and silicon/germanium films can be formed. The amount of processing that occurs is a function of both cluster ion energy and cluster ion dose. Increasing either gas-cluster ion energy or gas-cluster ion dose causes increased thickness of the films formed. At low energy-dose products the process herein referred to as "infusion" occurs (the semiconductor atoms, which as noted above may be present in amounts between 1 and 99 molecular percent in the gas cluster, and/or dopant atoms, which may be present in amounts between 0.01 and 10 molecular percent, in the gas-cluster ions become mixed into the shallow subsurface regions of the irradiated surface (362 and 422 in FIGS. 6 and 8 respectively). As the gas-cluster ion energy and/or dose is increased, there is a transition from "infusion" to film deposition and/or growth and the semiconductor and/or dopant materials in the gas-cluster ion beam grow or deposit a film on the substrate being irradiated. The formed films may be doped or un-doped dependent on whether dopant species are incorporated in the clusters. Specific examples of some of the useful processes will be given in additional detail hereinafter.

Experimental Results

Figure 9:
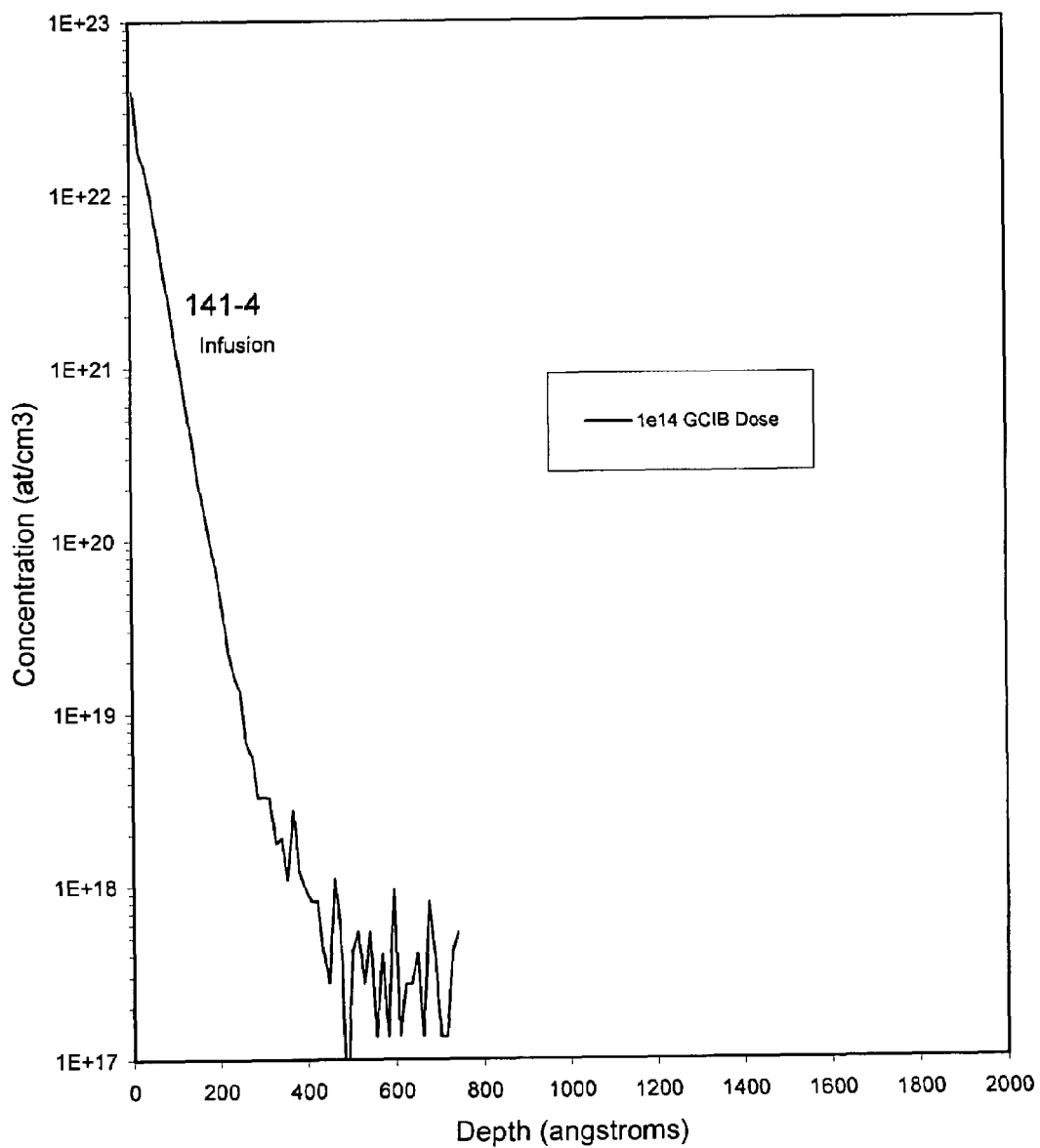
FIG. 9 is a graph showing SIMS measurement of a germanium infused surface film on a silicon substrate, the film having been formed by gas-cluster ion processing according to the invention.

FIG. 9 is a graph showing results of Secondary Ion Mass Spectrometry (SIMS) measurement of an infused film formed by a specific application of the invention. In this example (identified as sample 141-4), a gas-cluster ion beam processing system similar to that shown in FIG. 2 was used to process the surface of a silicon semiconductor wafer. A mixture of 5% germane (GeH$_4$) in argon was used as the source gas for gas-cluster formation. The ionized gas-cluster ion beam was accelerated by 5 kV acceleration and a dose of $1\times10^{14}$ gas-cluster ions/cm$^2$ was irradiated onto the silicon wafer. The SIMS analysis confirms that a film of approximately 200 angstroms depth is infused with germanium ions. The SIMS concentration axis is not accurately calibrated, but surface X-ray Photoelectron Spectroscopy (XPS) measurements confirm that germanium concentrations on the order of 20 atomic percent are achieved and that by varying process parameters germanium concentrations of from a few atomic percent to at least 40 atomic percent are achievable. Germanium concentrations within this range are useful for producing strains in silicon for enhancing carrier mobility.

Figure 10:
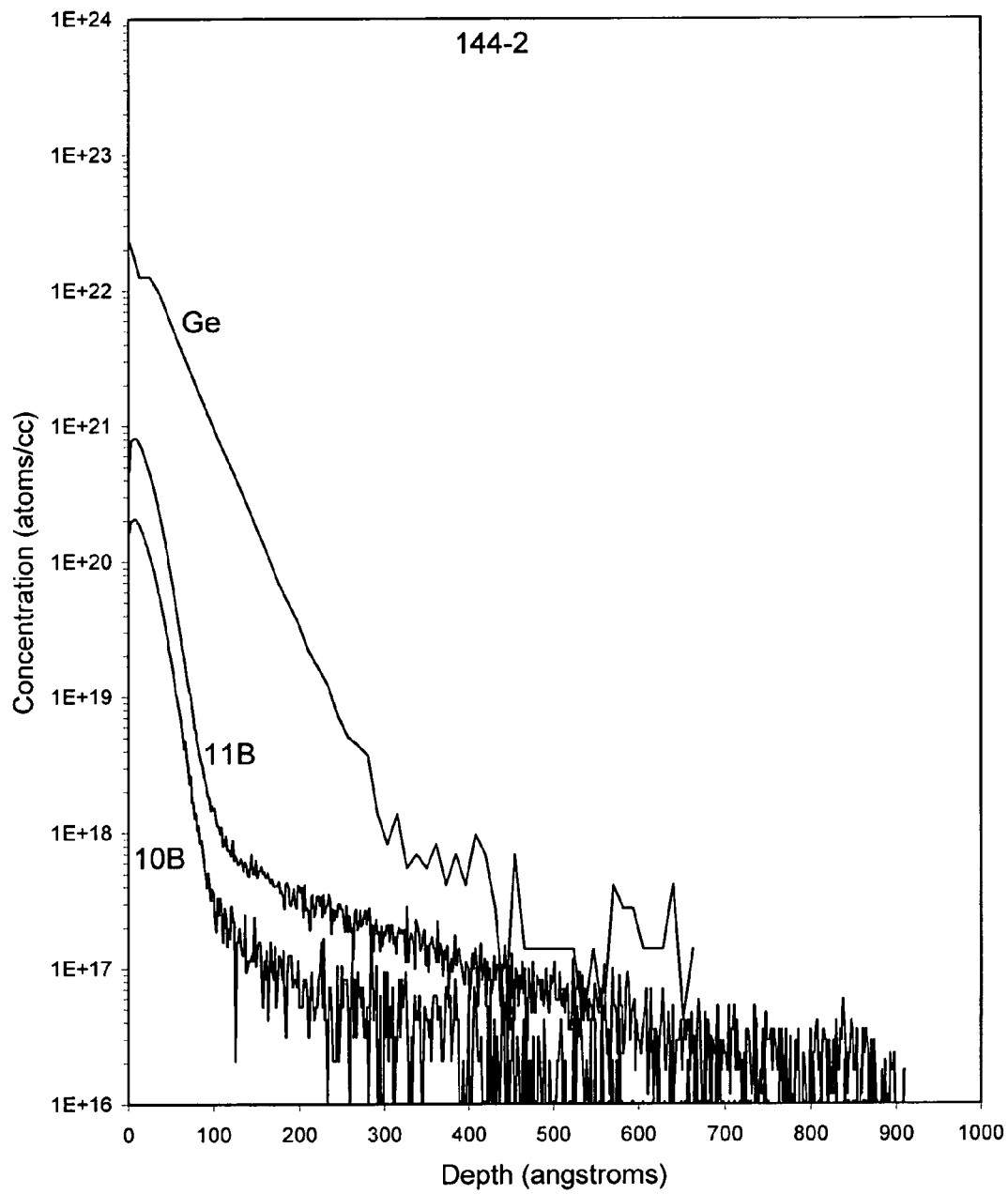
FIG. 10 is a graph showing SIMS measurement of a germanium and boron infused surface film on a silicon substrate, the film having been formed by gas-cluster ion processing according to an embodiment of the invention.

FIG. 10 is a graph showing results of SIMS measurement of an infused film formed by a specific application of the invention. In this example (identified as sample 144-2), a gas-cluster ion beam processing system similar to that shown in FIG. 2 was used to process the surface of a silicon semiconductor wafer. A mixture of 5% germane (GeH$_4$) in argon was used as one source gas for gas-cluster formation, while a mixture of 1% diborane (B$_2$H$_6$) in argon was used as a second source gas for gas-cluster formation. The two source gases were mixed as they flowed into the stagnation chamber—the germane mixture was fed at a rate of 300 sccm and the diborane mixture was fed at a rate of 75 sccm. The ionized gas-cluster ion beam was accelerated by 5 kV acceleration and a dose of $1\times10^{15}$ gas-cluster ions/cm$^2$ was irradiated onto the silicon wafer. The SIMS analysis confirms that a surface infused with germanium ions and simultaneously infused with boron ions for doping the silicon/germanium layer has been formed. The SIMS concentration axis is not accurately calibrated for germanium, but surface XPS measurements confirm that germanium concentrations on the order of 20 atomic percent are achieved and that by varying process parameters germanium concentrations of from a few atomic percent to at least 40 atomic percent are achievable. Germanium concentrations within this range are useful for producing strains in silicon for enhancing carrier mobility. Note that the boron doping depth is approximately 100 angstroms, which is very shallow and suited for the formation of shallow junctions.

Figure 11:
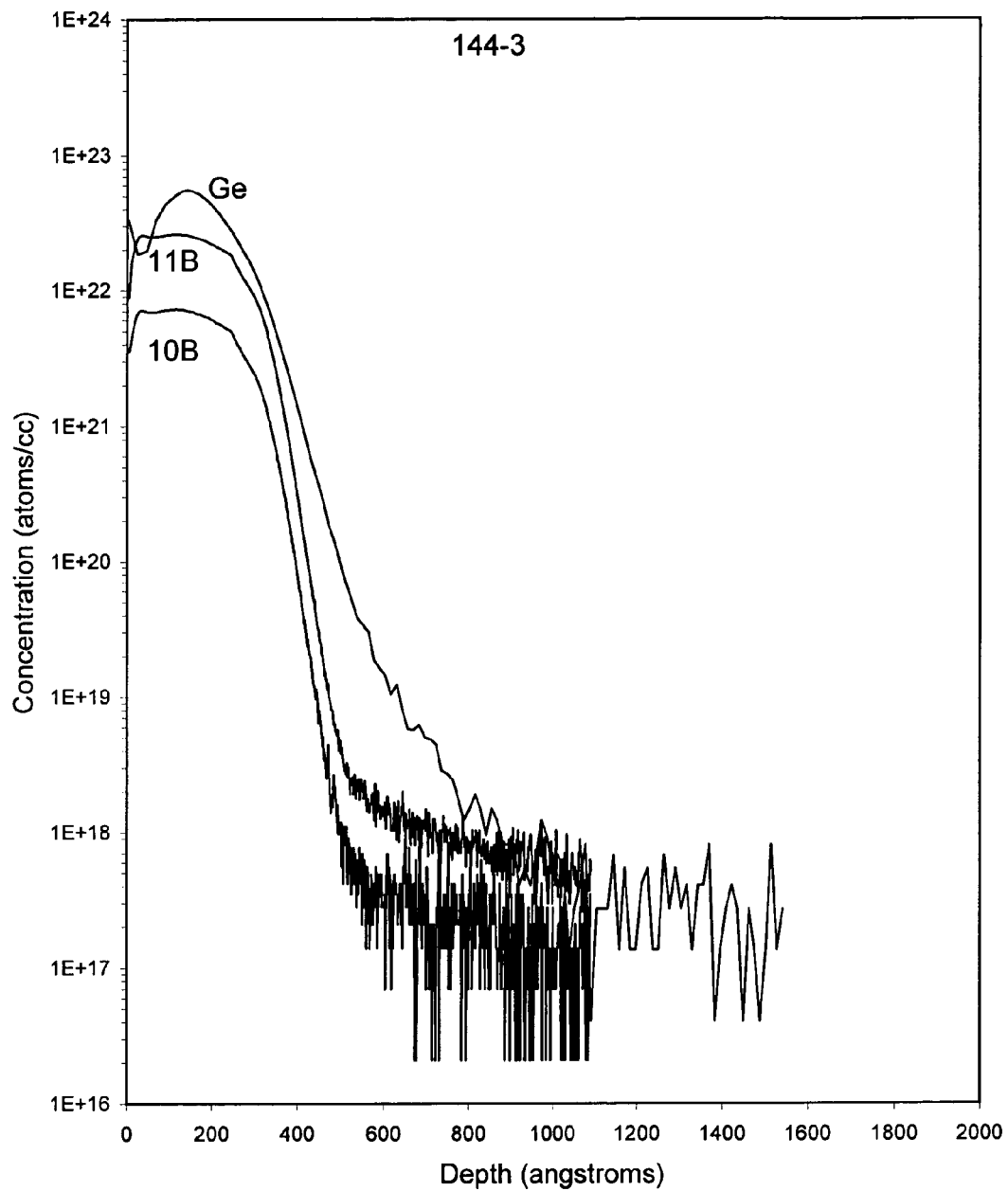
FIG. 11 is a graph showing SIMS measurement of a germanium and boron infused surface film on a silicon substrate, the film having been formed by gas-cluster ion processing according to an embodiment of the invention.

FIG. 11 is a graph showing results of SIMS measurement of an infused film formed by a specific application of the invention. In this example (identified as sample 144-3), a gas-cluster ion beam processing system similar to that shown in FIG. 2 was used to process the surface of a silicon semiconductor wafer. A mixture of 5% germane (GeH$_4$) in argon was used as one source gas for gas-cluster formation, while a mixture of 1% diborane (B$_2$H$_6$) in argon was used as a second source gas for gas-cluster formation. The two source gases were mixed as they flowed into the stagnation chamber—the germane mixture was fed at a rate of 30 sccm and the diborane mixture was fed at a rate of 300 sccm. The ionized gas-cluster ion beam was accelerated by 30 kV acceleration voltage and a dose of $1\times10^{15}$ gas-cluster ions/cm$^2$ was irradiated onto the silicon wafer. The SIMS analysis confirms that a surface infused with germanium ions and simultaneously infused with boron ions for doping the silicon/germanium layer has been formed. The SIMS analysis also shows that increased acceleration potential has increased the depth of the infused film in comparison to that of sample 144-2 of FIG. 10.

Figure 12:
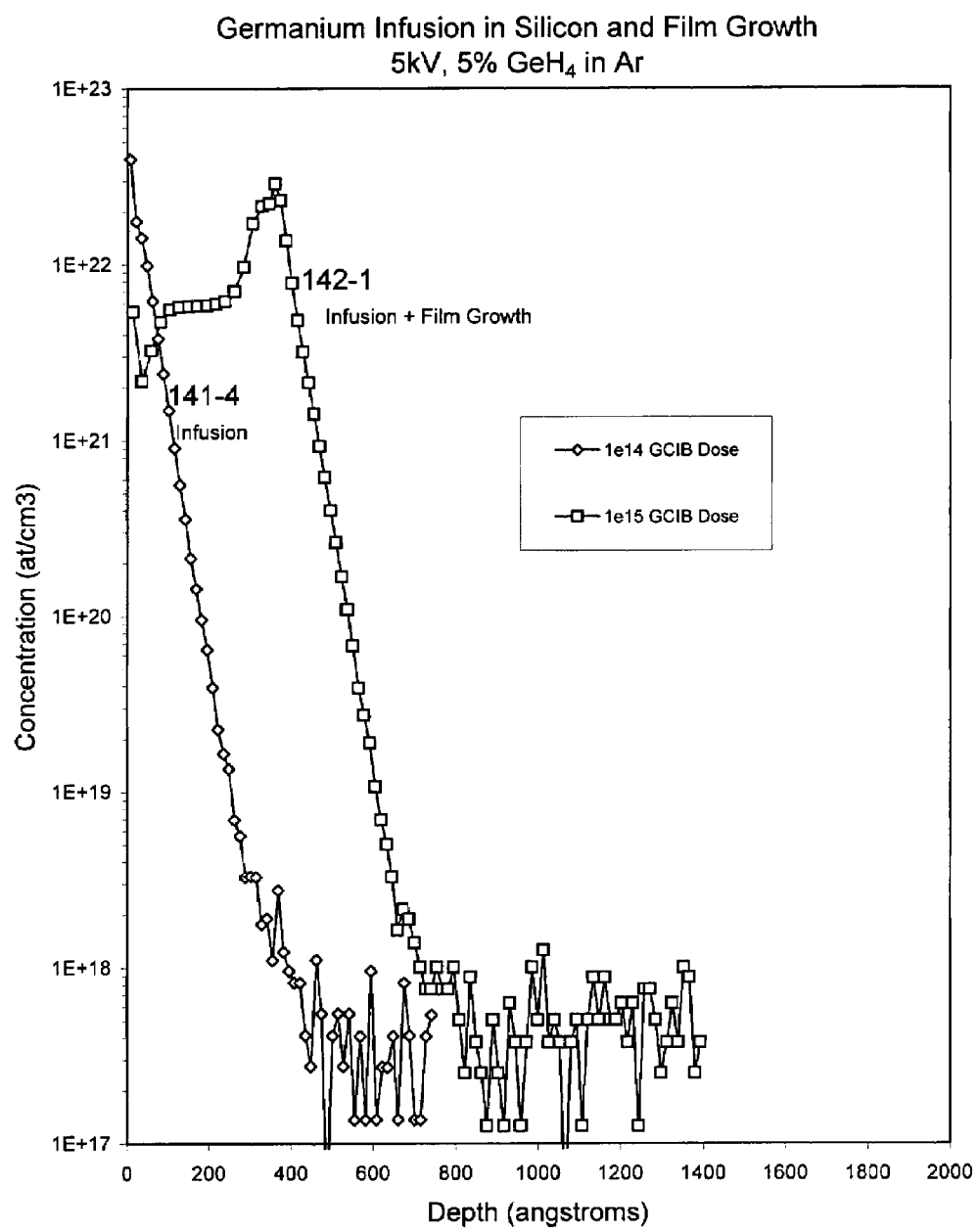
FIG. 12 is a graph comparing SIMS measurements of germanium-containing gas-cluster ion beam processing of a silicon semiconductor surface under two different processing conditions, one resulting in infusion of germanium into the silicon and one resulting in formation of a germanium film on the surface of the silicon, both according to embodiments of the invention.

FIG. 12 is a graph showing results of SIMS measurements for two films formed by specific applications of the invention. In these examples, the sample previously shown in FIG. 9 (identified as sample 1414) is compared to a similarly processed sample (identified as sample 142-1). A gas-cluster ion beam processing system similar to that shown in FIG. 2 was used to process the surface of both silicon semiconductor wafers. For both samples, a mixture of 5% germane (GeH$_4$) in argon was used as the source gas for gas-cluster formation. In both cases, the ionized gas-cluster ion beam was accelerated by 5 kV acceleration voltage and for sample 141-4 a dose of $1\times10^{14}$ gas-cluster ions/cm$^2$ was irradiated onto the silicon wafer, while for sample 142-1 a dose of $1\times10^{15}$ gas-cluster ions/cm$^2$ was irradiated onto the silicon wafer. For the 141-4 sample, SIMS analysis confirms that a film of approximately 200 angstroms depth is infused with germanium ions. For the higher dose 142-1 sample, the SIMS analysis shows an approximately 200 angstroms of silicon infused with germanium, with approximately 500 angstroms of additional germanium film deposited or grown on top of the germanium-infused silicon layer. The SIMS concentration axis is not accurately calibrated, but surface XPS measurements confirm infusion of germanium into silicon in the 141-4 sample and pure germanium surface film in the 142-1 sample. In the low dose case a germanium-infused silicon layer suitable for forming a strained silicon layer has been formed, while in the higher dose case, a germanium film has been deposited or grown on the silicon substrate, with a silicon/germanium interface region.

Figure 13:
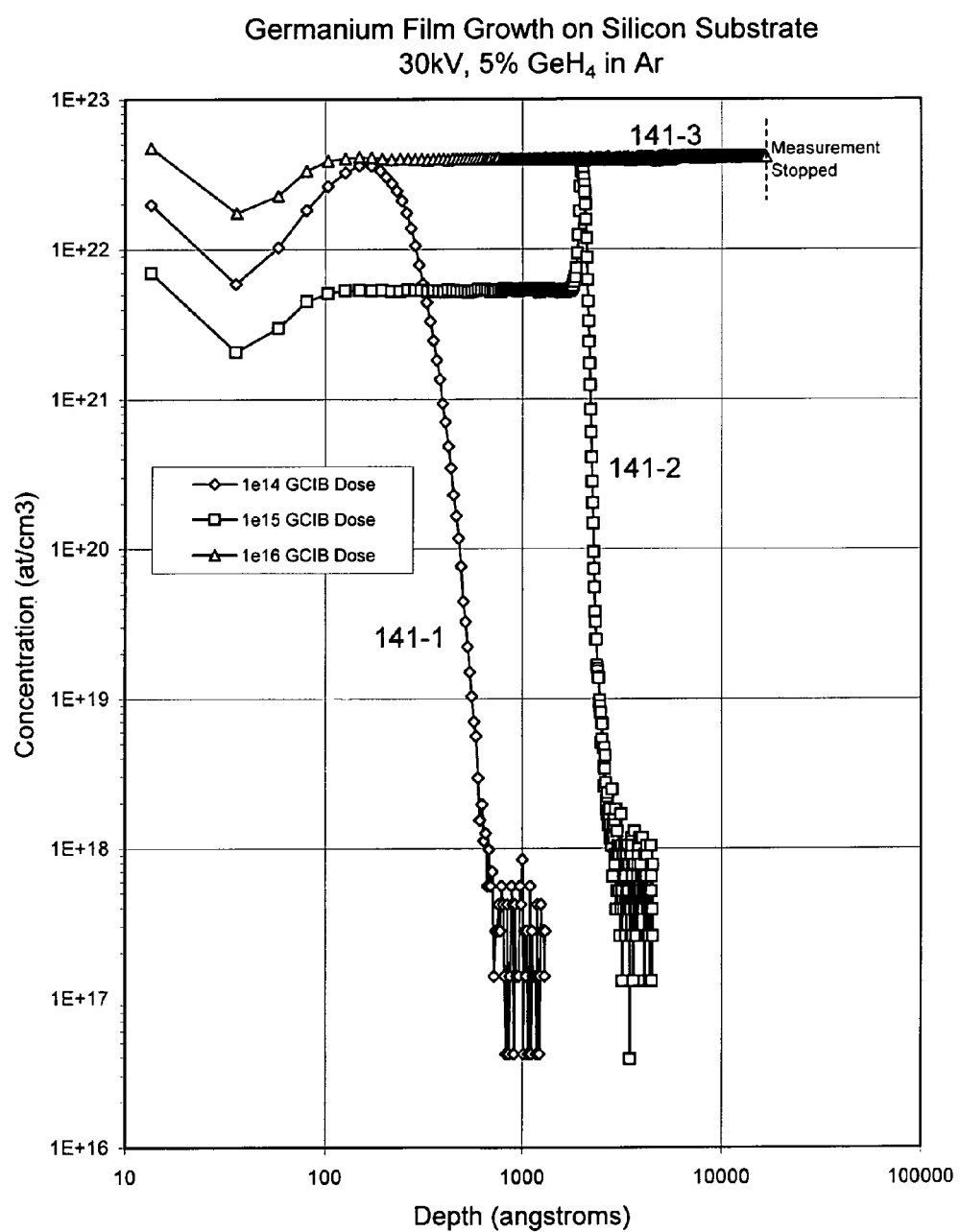
FIG. 13 is a graph comparing SIMS measurements of germanium films formed on a silicon substrate under different gas-cluster ion beam processing conditions, all according to embodiments of the invention.

FIG. 13 is a graph showing results of SIMS measurement of three germanium films deposited or grown by specific applications of the invention. In these examples, three samples (identified as samples 141-1, 141-2, and 141-3) are compared. A gas-cluster ion beam processing system similar to that shown in FIG. 2 was used to process the surface of all three silicon semiconductor wafer samples. For all three samples, a mixture of 5% germane (GeH$_4$) in argon was used as the source gas for gas-cluster formation. In each cases, the ionized gas-cluster ion beam was accelerated by 30 kV acceleration voltage and for sample 141-1 a dose of $1\times10^{14}$ gas-cluster ions/cm$^2$ was irradiated onto the silicon wafer, while for sample 141-2 a dose of $1\times10^{15}$ gas-cluster ions/cm$^2$ was irradiated onto the silicon wafer, and for sample 141-3 a dose of $1\times10^{16}$ gas-cluster ions/cm$^2$ was irradiated onto the silicon wafer. For the 141-1 sample, SIMS analysis confirms that a germanium film of approximately 600 angstroms is deposited or grown on the silicon substrate. For the higher dose 141-2 sample, the SIMS analysis shows that a germanium film of approximately 1200 angstroms is deposited or grown on the silicon substrate. For the highest dose 141-3 sample, the SIMS analysis shows that a germanium film in excess of 11000 angstroms thick was deposited or grown on the silicon substrate. The SIMS concentration axis is not accurately calibrated, but surface XPS measurements confirm growth or deposition of pure germanium films. In comparing the 141-1 sample of FIG. 13 with the 141-4 sample of FIGS. 9 and 12 it is seen that the higher acceleration potential of 30 kV used with sample 141-1 results in deposition or growth of a germanium film rather than infusion of germanium into silicon as occurred with the 141-4 sample. It is also noted that the lower energy, higher dose 142-1 example (5 kV, 1×10$^{15}$ dose) of FIG. 12 and the higher energy, lower dose 141-1 example (30 kV, 1×10$^{14}$ dose) of FIG. 13 deposit or grow germanium films of similar thickness on the two silicon substrates.

Figure 14:
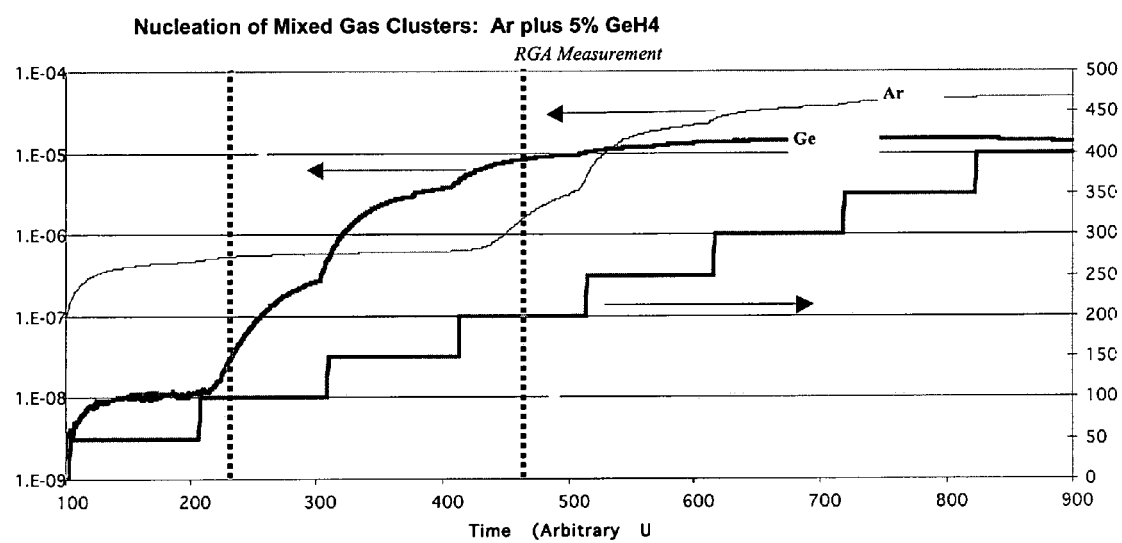
FIG. 14 is a graph that shows how the composition of a GCIB formed from a mixture of source gasses depends on nozzle flow parameters.

FIG. 14 is a graph that illustrates a dependence of the composition of a GCIB formed from a mixture of source gasses on nozzle flow parameters. In this case the source gas mixture is 5% GeH$_4$ in Argon. During the measurement illustrated in the graph, a GCIB processing equipment similar to that shown in FIG. 3 was operated at progressively higher nozzle 110 flow rates (corresponding to progressively higher stagnation chamber 116 pressures). A residual gas analyzer (RGA) was operated to analyze gas in the process chamber 108 (primarily dissociation products evolved when the GCIB 128 strikes the workpiece 152 or the beam current sensor 218, and thus indicative of the gas-cluster ions composition. The traces labeled Ge and Ar represent, respectively, the partial pressures of germane and argon gas in the process chamber 108. The stairstep trace indicates the source gas flow (in sccm) in the nozzle 110. At low flows, the cluster ion beam comprises nearly all germane because germane nucleates at lower flows. At higher flows, gas cluster ion beam comprises an increasingly higher partial pressure of argon and begins to approach the fraction in the original gas mixture. It is noted that there is a noticeable onset of nucleation for each of the component gases in the mixture. Thus in forming compound clusters from gas mixtures it is important to assure that the nozzle flow employed exceeds the flow at which both constituents have exceeded their onset of nucleation. It is also important for repeatable processing results that not only the gas mixture percentages, but also the nozzle flow rates be repeatable from process to process to insure repeatability of the mixture of gas cluster ion composition.

In addition to providing the ability to deposit or grow a germanium film as described above, the invention can also be used to deposit or grow a silicon-germanium film by using clusters containing both germanium and silicon. For example, by using a first source gas of 5% germane in argon and using a second source gas of 5% silane in argon and mixing the two gases in a desired ratio of flows as they are fed into the cluster beam source, silicon-germanium films in controllable ratios are grown on various substrates including silicon, silicon-on-insulator, silicon dioxide, or other dielectrics by application of the invention. The substrates for deposition and/or growth may be crystalline or non-crystalline. By adding a dopant species to the gas mixture used to form the gas-cluster ions, the deposited and/or grown semiconductor films are also doped. The deposited or grown semiconductor films tend to be amorphous or polycrystalline, but they can be converted to crystalline films by applying a thermal annealing step, either a rapid anneal or a furnace anneal, preferably a non-diffusing or low-diffusing anneal.

By using a carbon-containing gas, methane, for example, mixed with argon as the source gas, carbon-containing clusters can be formed. Carbon-containing clusters can be infused into silicon to form strained silicon as is accomplished with germanium. However, because the carbon atoms are smaller than silicon atoms, the resulting strain is tensile rather than compressive as in the case of germanium induced strain. This, in combination with the use of masking steps to produce localized infusion, makes it possible to infuse germanium into silicon in some regions while infusing carbon into silicon in other regions, thus providing the flexibility to readily produce regions of both compressive and tensile strain on a single wafer.

FIGS. 6 and 8 illustrate blanket and localized (respectively) processing of the surfaces of a semiconductor substrate, depending on whether or not the gas-cluster ion beam processing is performed across the entire semiconductor substrate surface or only through mask openings. While the foregoing discussion has often referred to the semiconductor wafer 302 as a silicon wafer, it is recognized that the processes of the invention are not restricted to application to bulk silicon, but can also be applied to silicon-on-insulator films. When the invention is used to deposit or grow semiconductor films on a surface, it is recognized that the invention is not limited to depositing or growing films on only silicon or silicon-on-insulator substrates, but that such films also may be deposited or grown on silicon dioxide layers and other dielectric layers and that the substrates can be crystalline, polycrystalline, or amorphous.

Although the invention has been described with respect to various embodiments, it should be realized this invention is also capable of a wide variety of further and other embodiments within the spirit of the invention.

We claim:

1. A method for forming one or more strained regions in a semiconductor substrate, comprising the steps of:
   maintaining a reduced-pressure environment around a substrate holder for holding a semiconductor substrate having a surface;
   holding the semiconductor substrate securely within said reduced-pressure environment;
   providing to said reduced-pressure environment a gas-cluster ion beam from a pressurized gas mixture including at least one strain-inducing atom species;
   accelerating the gas-cluster ion beam;
   irradiating the accelerated gas-cluster ion beam onto one or more portion(s) of the surface of the semiconductor substrate; and
   annealing at least the irradiated portion(s) to form one or more substantially crystalline strained semiconductor regions within the substrate.

2. The method of claim 1, wherein the providing step further comprises the steps of:
   delivering the pressurized gas mixture to an expansion nozzle;
   flowing the pressurized gas mixture through the expansion nozzle into the reduced-pressure environment to form a jet containing gas-clusters; and
   ionizing at least a portion of the gas-clusters to form the gas-cluster ion beam.

3. The method of claim 2 wherein the flowing step controllably flows the pressurized gas mixture so as to control the relative proportion, of nucleation of at least two constituents of the gas mixture into gas-clusters.

4. The method of claim 1, wherein:
   The pressurized gas mixture further includes a noble gas; and
   the strain-inducing atom species comprises at least one species selected from the group consisting of a semiconductor atom species and C.

5. The method of claim 4, wherein:
   the noble gas comprises Ar or Xe; and the pressurized gas mixture further includes one or more gases selected from the group consisting of $GeH_4$, $GeF_4$, $SiH_4$, $SiF_4$, $BF_3$, $B_2H_6$, $PH_3$, $PF_5$, $AsH_3$, and $AsF_5$.

6. The method of claim 1, wherein the pressurized gas mixture includes at least one atom species selected from the group consisting of Si and Ge.

7. The method of claim 1, wherein the pressurized gas mixture includes at least one dopant atom species selected from the group consisting of P, B and As.

8. The method of claim 1, wherein the strained region formed has a concentration of strain-inducing atom species of from about 5 to 40 atomic percent.

9. The method of claim 1, wherein the pressurized gas mixture includes a gas containing a dopant atom species, the gas present in the pressurized gas mixture in an amount of from about 0.01 to 10 molecular percent.

10. The method of claim 1, further comprising the step of providing a mask on the surface of the semiconductor substrate for controlling the portion of the surface of the semiconductor substrate that is irradiated.

11. The method of claim 10, wherein at least one of the one or more strained semiconductor regions induces strain in one or more adjacent un-irradiated regions of the semiconductor substrate.

12. The method of claim 1, wherein the pressurized gas mixture includes at least one dopant atom species and further wherein one or more strained semiconductor regions is a doped strained semiconductor region.

13. The method of claim 1, wherein the semiconductor substrate is a crystalline, polycrystalline, or amorphous semiconductor.

14. The method of claim 1, wherein the semiconductor substrate is essentially silicon.

15. The method of claim 1, wherein the annealing step is a thermal annealing step.

16. The method of claim 1, wherein the gas-cluster ions of the gas-cluster ion beam are accelerated by an acceleration voltage between 1 and 70 kV.

17. A semiconductor substrate including one or more strained regions formed by irradiating one or more portions of the substrate with an accelerated gas-cluster ion beam as in the method of claim 1.

18. The substrate of claim 17, wherein the one or more strained regions include therein at least one atom species selected from the group consisting of semiconductor atom species, dopant atom species, and C.

19. The substrate of claim 17, wherein in the semiconductor substrate is a crystalline, polycrystalline, or amorphous semiconductor.

20. The substrate of claim 17, wherein in the semiconductor substrate is essentially silicon.

21. A method for forming a semiconductor thin film at a surface of a substrate, comprising the steps of:
maintaining a reduced-pressure environment around a substrate holder for holding a substrate having a surface;
holding the substrate securely within said reduced-pressure environment;
providing to said reduced-pressure environment a gas-cluster ion beam from a pressurized gas mixture including at least one atom species selected from the group of elements consisting of Si and Ge;
accelerating the gas-cluster ion beam; and
irradiating the accelerated gas-cluster ion beam onto at least a portion of the surface of the substrate to form a semiconductor thin film.

22. The method of claim 21, wherein the providing step further comprises the steps of:
delivering the pressurized gas mixture to an expansion nozzle;
flowing the pressurized gas mixture through the expansion nozzle into the reduced-pressure environment to form a jet containing gas-clusters; and
ionizing at least a portion of the gas-clusters to form the gas-cluster ion beam.

23. The method of claim 22, wherein the flowing step controllably flows the pressurized gas mixture so as to control the relative degree (or proportion, or ratio) of nucleation of at least two constituents of the gas mixture into gas-clusters.

24. The method of claim 21, wherein the pressurized gas mixture further includes a noble gas.

25. The method of claim 21, wherein the semiconductor thin film formed has a concentration of at least one semiconductor atom species from about 5 to 40 atomic percent.

26. The method of claim 21, wherein the pressurized gas mixture further includes at least one dopant atom species selected from the group consisting of P, B and As.

27. The method of claim 21, wherein the pressurized gas mixture includes a gas containing at least one dopant atom species, the gas present in the gas mixture in an amount from about 0.01 to 10 molecular percent.

28. The method of claim 21, wherein the pressurized gas mixture further includes C.

29. The method of claim 28, wherein the concentration of C in the semiconductor thin film formed is from about 5 to 40 atomic percent.

30. The method of claim 21, wherein:
the noble gas comprises Ar or Xe; and
the pressurized gas mixture further includes one or more gases selected from the group consisting of $GeH_4$, $GeF_4$, $SiH_4$, $SiF_4$, $BF_3$, $B_2H_6$, $PH_3$, $PF_5$, $AsH_3$, and $AsF_5$.

31. The method of claim 21, further comprising the step of providing a mask on a surface of the substrate for controlling the portion of the surface of the substrate that is irradiated by the accelerated gas-cluster ion beam.

32. The method of claim 21, wherein the pressurized gas mixture included at least one dopant atom species and further wherein the semiconductor thin film is a doped semiconductor thin film.

33. The method of claim 21, wherein the substrate is composed of a semiconductor, a dielectric material, or a silicon-on-insulator material.

34. The method of claim 21, wherein the substrate is crystalline, polycrystalline, or amorphous.

35. The method of claim 21, wherein the semiconductor thin film comprises silicon carbide.

36. The method of claim 21, further comprising the step of annealing the semiconductor thin film.

37. The method of claim 21, wherein the gas cluster ions of the gas-cluster ion beam are accelerated by an acceleration voltage between 1 and 70 kV.

38. A method for forming one or more strained regions in a semiconductor substrate, comprising the steps of:
providing a mask on the surface of the semiconductor substrate;
maintaining a reduced-pressure environment around a substrate holder for holding a semiconductor substrate having a surface;
holding the semiconductor substrate securely within said reduced pressure environment;

providing to said reduced-pressure environment a gas cluster ion beam from a pressurized gas mixture including at least one strain-inducing atom species;

accelerating the gas-cluster ion beam; and irradiating the accelerated gas-cluster ion beam into one or more portions of the surface of the semiconductor substrate to form one or more strained semiconductor regions within the substrate, at least one of the one or more strained semiconductor regions inducing strain in one or more adjacent un-irradiated regions of the semiconductor substrate.

39. A method for forming one or more strained semiconductor regions in a semiconductor thin film at a surface of a substrate, comprising the steps of:

forming the semiconductor thin film at the surface of the substrate by irradiating the surface of the substrate with a gas-cluster ion beam; and forming the one or more strained semiconductor regions in the semiconductor thin film by irradiating the formed semiconductor thin film with a gas-cluster ion beam.

40. A method of forming one or more strained semiconductor regions in a semiconductor thin film at a surface of a substrate, comprising the steps of:

maintaining a reduced-pressure environment around a substrate holder for holding a substrate having a surface;

holding the substrate securely within said reduced-pressure environment;

providing to said reduced-pressure environment a gas-cluster ion beam from a pressurized gas mixture including at least one semiconductor atom species;

accelerating the gas-cluster ion beam;

irradiating the accelerated gas-cluster ion beam into at least a portion of the surface of the substrate to form a semiconductor thin film;

providing within said reduced-pressure environment a gas-cluster ion beam from a pressurized gas mixture including at least one strain-inducing atom species;

accelerating the last said gas-cluster ion beam;

irradiating the accelerated gas-cluster ion beam into one or more portions of the semiconductor thin film to strain the film; and annealing at least the irradiated portions of the semiconductor thin film.

* * * * *